(12) United States Patent
Kocon

(10) Patent No.: US 12,009,421 B2
(45) Date of Patent: **\*Jun. 11, 2024**

(54) SEMICONDUCTOR ON INSULATOR ON WIDE BAND-GAP SEMICONDUCTOR

(71) Applicant: TEXAS INSTRUMENTS INCORPORATED, Dallas, TX (US)

(72) Inventor: Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/161,515

(22) Filed: Jan. 30, 2023

(65) Prior Publication Data

US 2023/0178649 A1 Jun. 8, 2023

Related U.S. Application Data

(63) Continuation of application No. 17/130,969, filed on Dec. 22, 2020, now Pat. No. 11,569,378.

(51) Int. Cl.
*H01L 29/78* (2006.01)
*H01L 29/267* (2006.01)
*H01L 29/40* (2006.01)
*H01L 29/66* (2006.01)

(52) U.S. Cl.
CPC ........ *H01L 29/7816* (2013.01); *H01L 29/267* (2013.01); *H01L 29/404* (2013.01); *H01L 29/66431* (2013.01); *H01L 29/66462* (2013.01)

(58) Field of Classification Search
CPC . H01L 29/7816; H01L 29/267; H01L 29/404; H01L 29/66431; H01L 29/66462
See application file for complete search history.

(56) References Cited

U.S. PATENT DOCUMENTS

| | | | |
|---|---|---|---|
| 5,736,766 A | 4/1998 | Efland et al. | |
| 6,424,005 B1 | 7/2002 | Tsai et al. | |
| 10,084,073 B2 | 9/2018 | Qi | |
| 11,152,364 B1 | 10/2021 | Lin | |
| 2004/0031981 A1 | 2/2004 | Grivna | |
| 2008/0012069 A1 | 1/2008 | Mizokuchi | |
| 2017/0018617 A1 | 1/2017 | Xia et al. | |
| 2021/0074702 A1* | 3/2021 | Le | H01L 27/0688 |

\* cited by examiner

*Primary Examiner* — Mohammed R Alam
(74) *Attorney, Agent, or Firm* — Yudong Kim; Frank D. Cimino

(57) ABSTRACT

A semiconductor device includes a first semiconductor structure. The first semiconductor structure includes a first semiconductor material having a band-gap. The first semiconductor structure has a first surface. An insulating layer has first and second opposing surfaces. The first surface of the insulating layer is on the first surface of the first semiconductor structure. A second semiconductor structure is on the second surface of the insulating layer and includes a second semiconductor material having a band-gap that is smaller than the band-gap of the first semiconductor material. A floating electrode couples the first semiconductor structure to the second semiconductor structure.

20 Claims, 14 Drawing Sheets

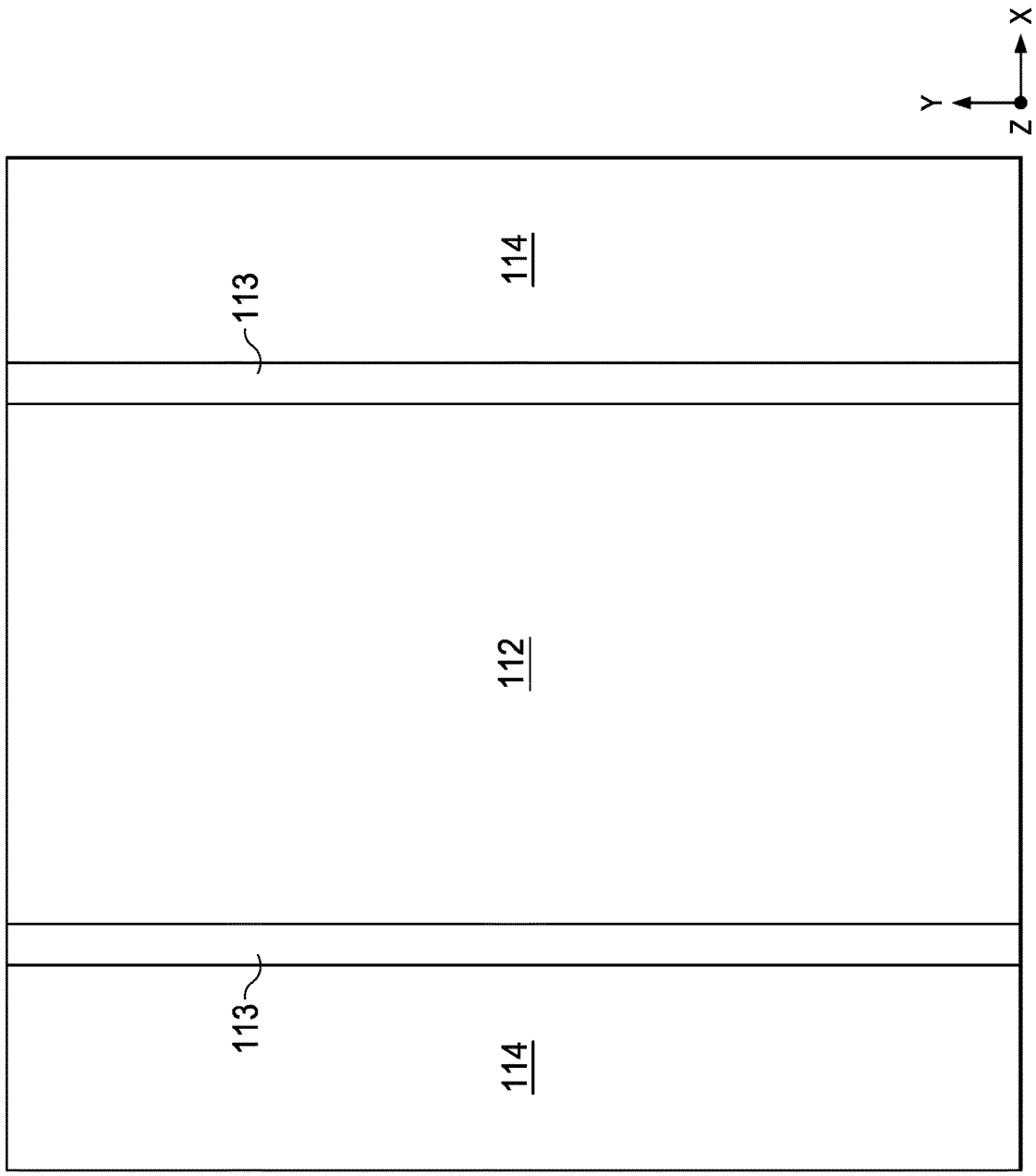

SEMICONDUCTOR ON INSULATOR ON WIDE BAND-GAP SEMICONDUCTOR

CROSS-REFERENCE TO RELATED APPLICATIONS

The present application is a continuation of U.S. patent application Ser. No. 17/130,969, entitled "SEMICONDUCTOR ON INSULATOR ON WIDE BAND-GAP SEMICONDUCTOR," filed on Dec. 22, 2020, and the entirety of which is hereby incorporated herein by reference.

BACKGROUND

Semiconductor switching devices include diodes, bipolar transistors, metal-oxide-semiconductor (MOS) field-effect transistors (FET), etc. Semiconductor switching devices such as silicon switching devices have a broad range of applications. For example, silicon laterally-diffused metal oxide semiconductor (LDMOS) field-effect transistor (FET) may be used as a power switch in the power electronics industry.

SUMMARY

In one example, a semiconductor device includes a first semiconductor structure. The first semiconductor structure includes a first semiconductor material having a band-gap. The first semiconductor structure has a first surface. An insulating layer has first and second opposing surfaces. The first surface of the insulating layer is on the first surface of the first semiconductor structure. A second semiconductor structure is on the second surface of the insulating layer and includes a second semiconductor material having a band-gap that is smaller than the band-gap of the first semiconductor material. A floating electrode couples the first semiconductor structure to the second semiconductor structure.

In another example, a semiconductor device includes a first semiconductor structure including a first semiconductor material having a band-gap. The first semiconductor structure includes a p-type region, an n-type region, and a junction region between the p-type and n-type regions. The first semiconductor structure has a first surface. An insulating layer has first and second opposing surfaces. The first surface of the insulating layer is on the first surface of the first semiconductor structure. A second semiconductor structure is on the second surface of the insulating layer and includes a second semiconductor material having a band-gap that is smaller than the band-gap of the first semiconductor material. The second semiconductor structure includes an n-type drift region, a p-type well region surrounded by the n-type drift region, a n-type source region surrounded by p-type well region, and a gate terminal over the n-type drift region, the p-type well region, and the n-type source region. A first floating electrode couples the n-type region of the first semiconductor structure to the n-type drift region of the second semiconductor structure. A second floating electrode couples the p-type region of the first semiconductor structure to the gate terminal of the second semiconductor structure. A material of a floating electrode may include at least one of metal or silicide.

In another example, a formation method for forming a semiconductor device includes bonding an insulating layer with a first semiconductor structure that has a first surface and a first semiconductor material having a band-gap. The insulating layer has first and second opposing surfaces, the first surface of the insulating layer is attached to the first surface of the first semiconductor structure. A second semiconductor structure is formed on the second surface of the insulating layer. A semiconductor layer is bonded with the second surface of the insulating layer. The semiconductor layer includes a second semiconductor material having a band-gap that is smaller than the band-gap of the first semiconductor material. Components are formed in the semiconductor layer. A floating electrode is formed. The floating electrode couples the first semiconductor structure with second semiconductor structure.

BRIEF DESCRIPTION OF THE DRAWINGS

For a detailed description of various examples, reference will now be made to the accompanying drawings in which:

FIGS. 1 to 6A, 6B, and 6C illustrate cross-sectional views of structures at various stages of the formation of a semiconductor device according to described examples;

FIGS. 6D, and 6E illustrate other examples cross-sectional views of structures of a semiconductor device of FIG. 6A;

DETAILED DESCRIPTION

Progress of silicon devices is slowing and ultimately limited by Silicon material properties. After more than 30 years of silicon processing development, ability to use current semiconductor fabrication is a path to quick adoption and best performance to cost ratio when making semiconductor devices, such as a laterally-diffused metal oxide semiconductor (LDMOS) field-effect transistor (FET).

The described examples include a semiconductor device and a formation method for forming the semiconductor device. The illustrative semiconductor device includes a first semiconductor structure including a first semiconductor material having a band-gap; an insulating layer having first and second opposing surfaces, where the first surface of the insulating layer is on the first semiconductor structure; a second semiconductor structure on the second surface of the insulating layer and including a second semiconductor material having a band-gap that is smaller than the band-gap of the first semiconductor material; and a floating electrode coupling the first semiconductor structure to the second semiconductor structure. The semiconductor device may combine reliable devices such as silicon switching devices with wide band-gap (WBG) semiconductor devices, to form a hybrid semiconductor device. The WBG semiconductor in the hybrid semiconductor device may provide a voltage supporting region to take a portion or a large portion of the applied voltage on the hybrid semiconductor device, such that the voltage applied to other portions of the hybrid semiconductor device, such as the silicon switching device/portion, may be reduced. The critical voltage of the hybrid semiconductor device may be increased.

Figure 1:
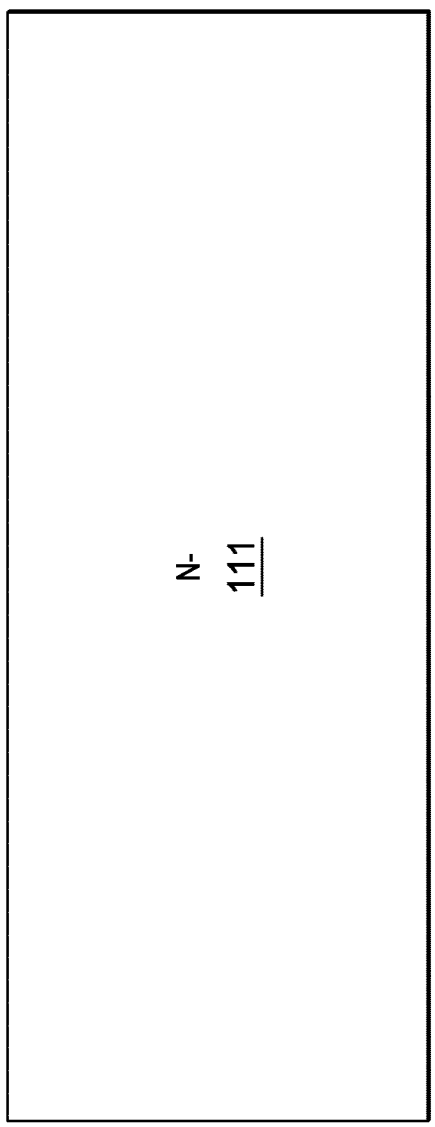
Figure 2:
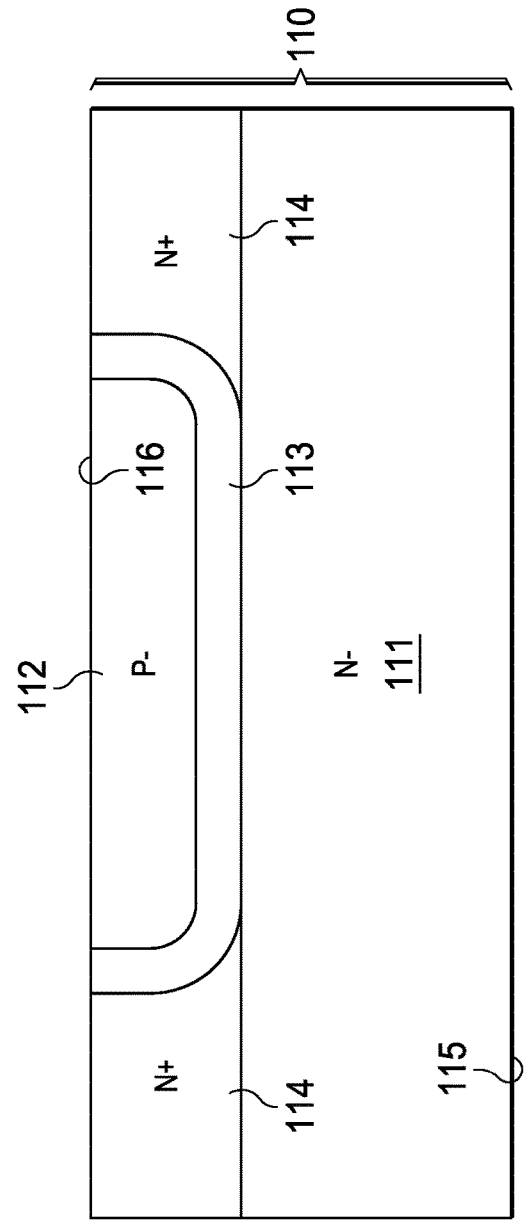
Figure 5:
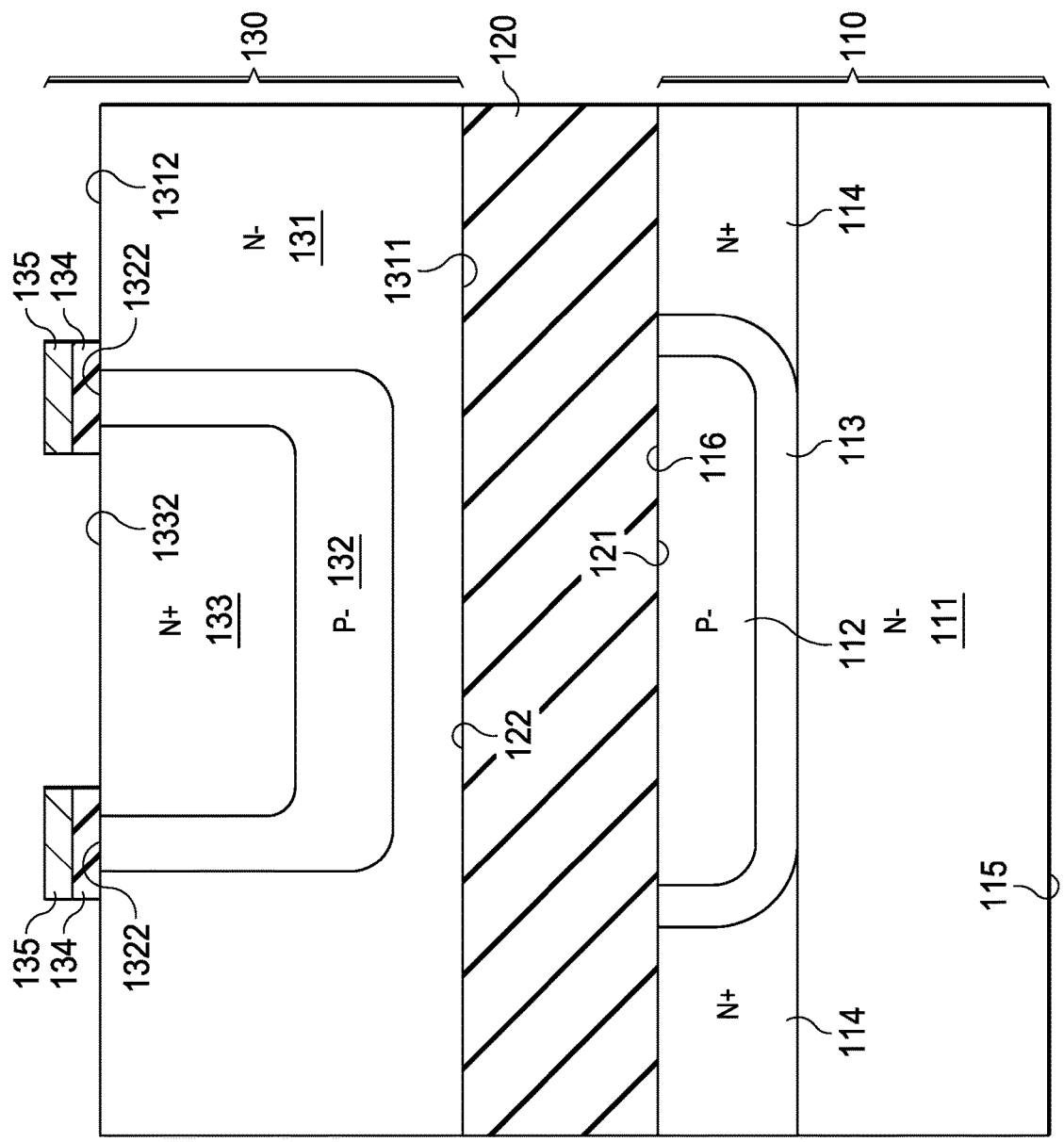
Figure 6A:
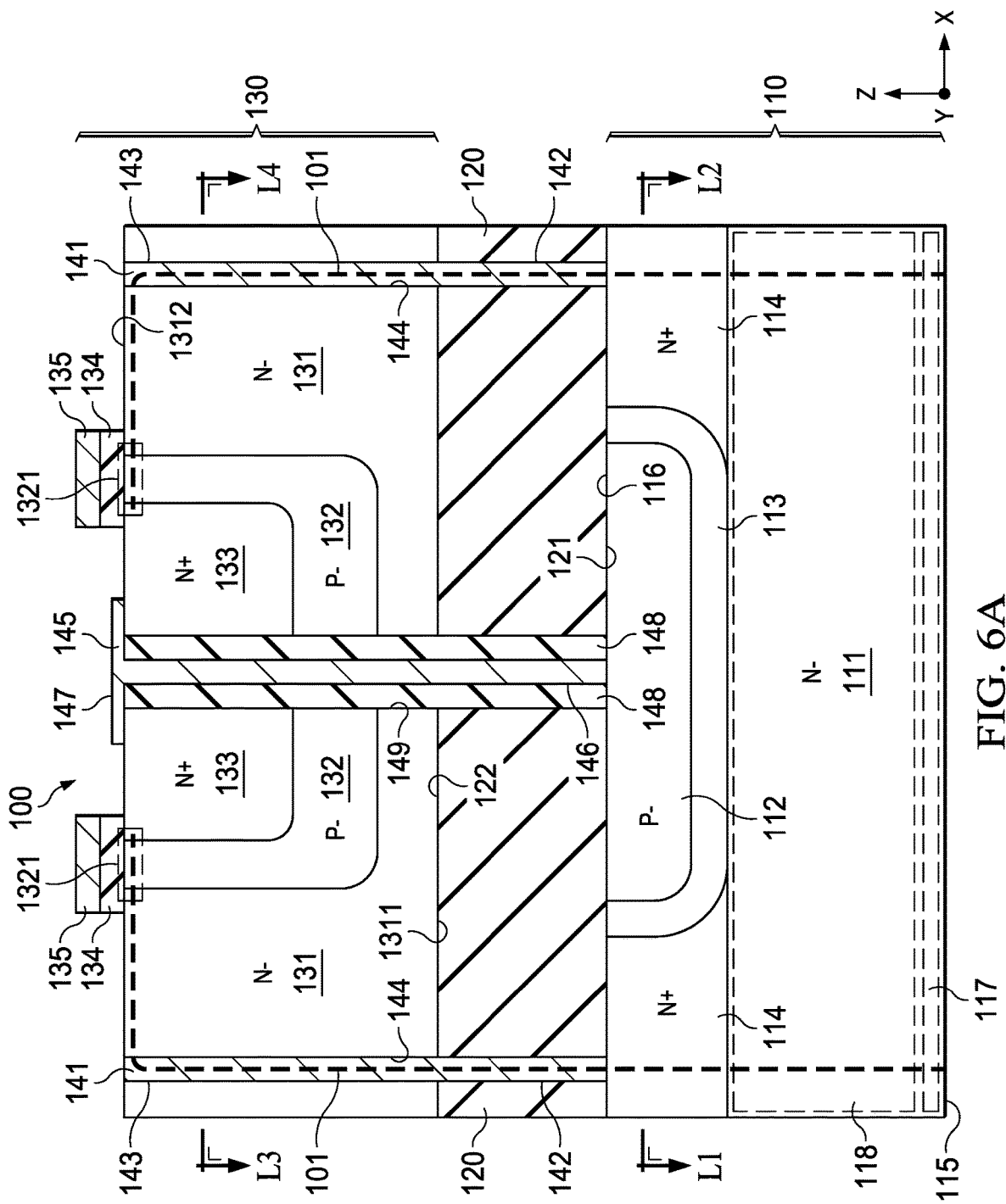
Figure 6B:
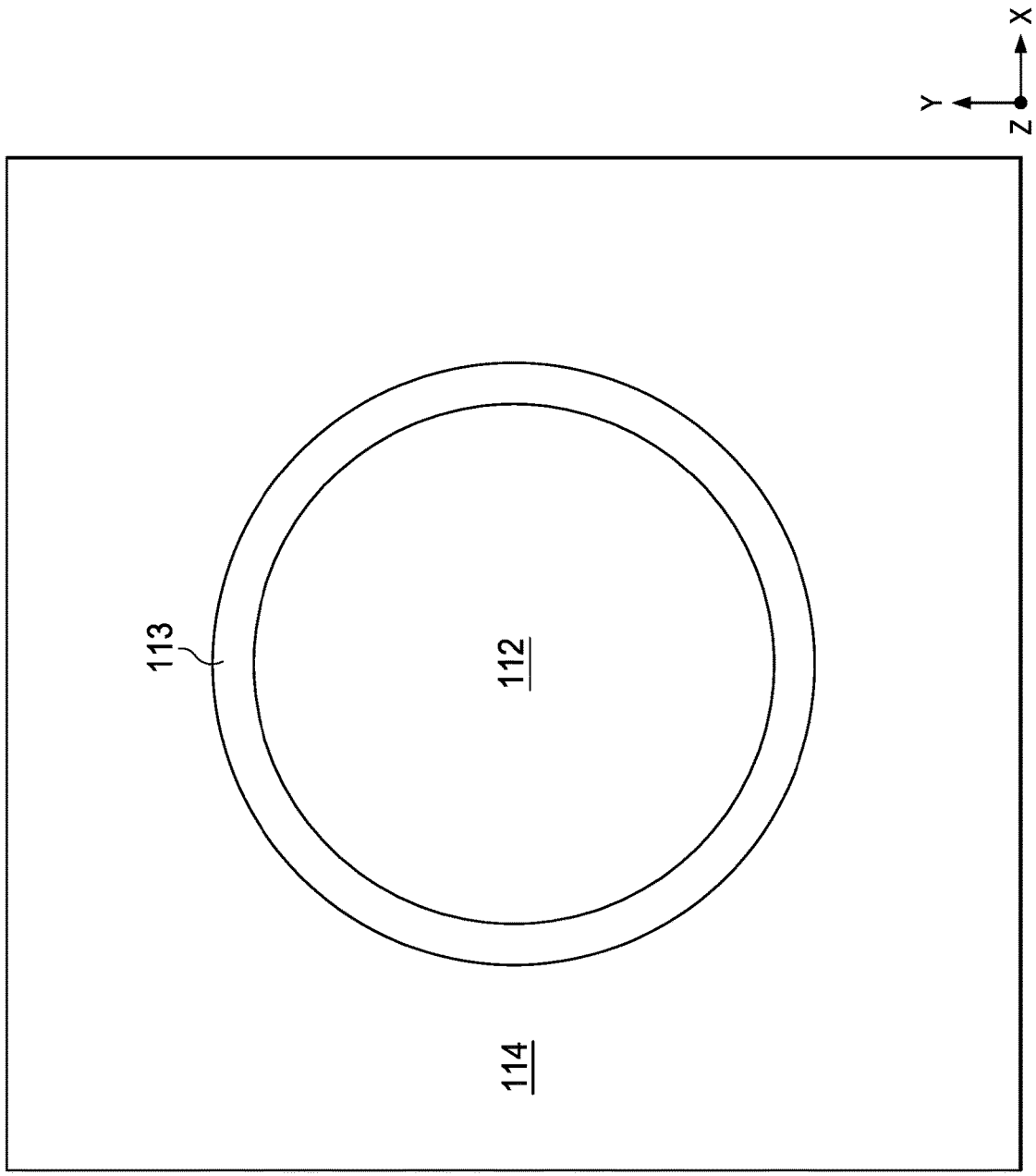
Figure 6C:
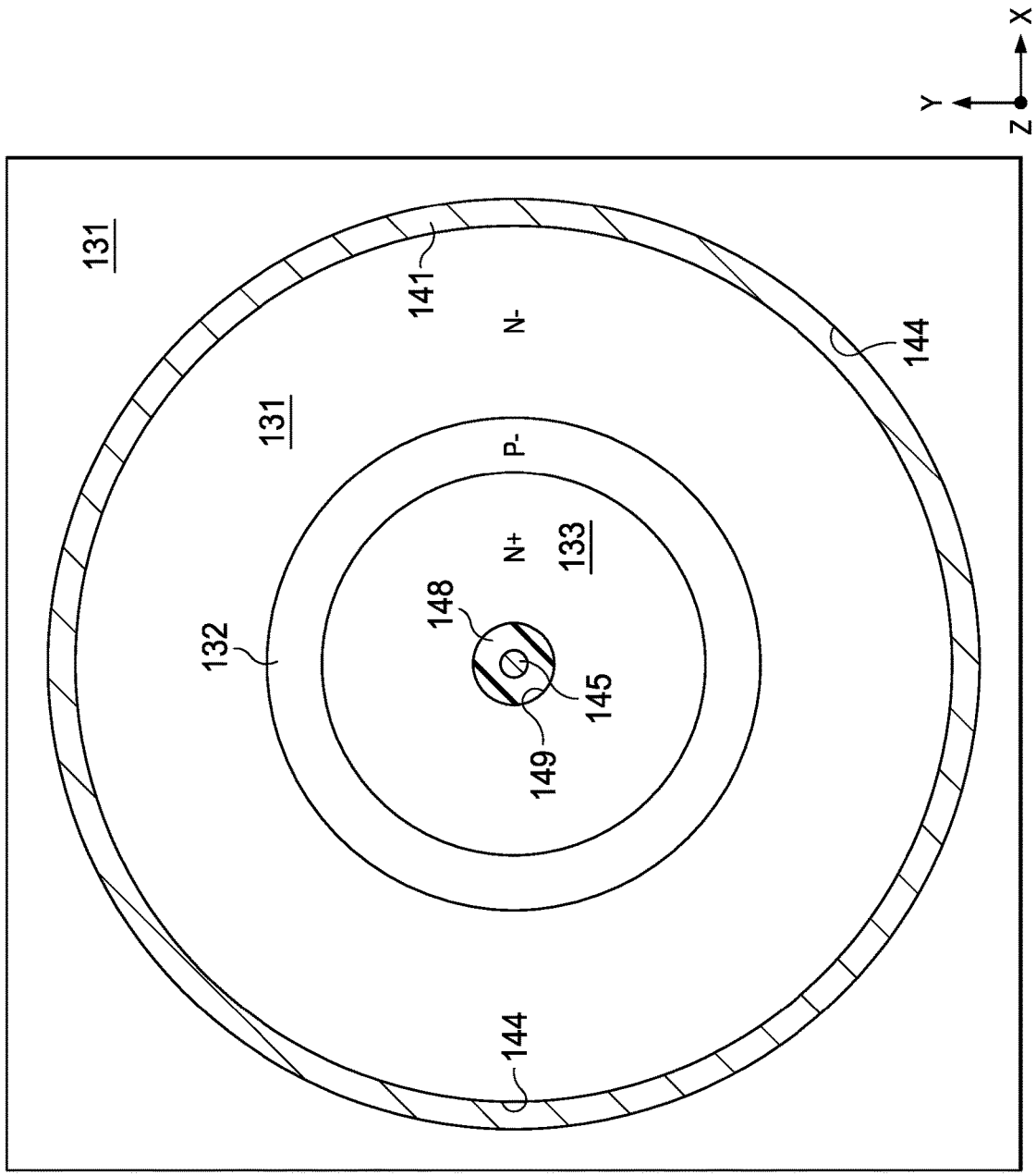
Figure 6E:
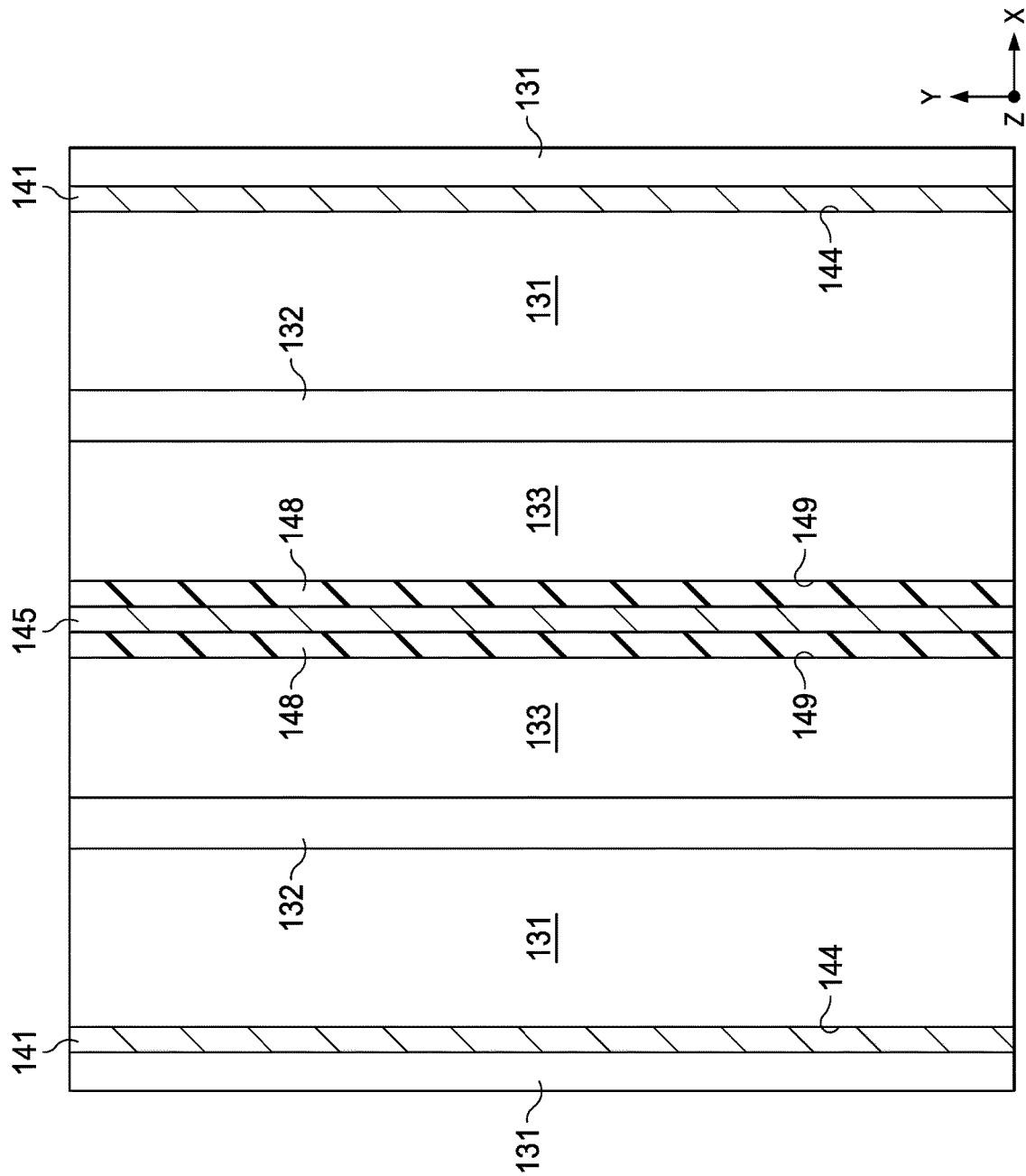
Figure 7:
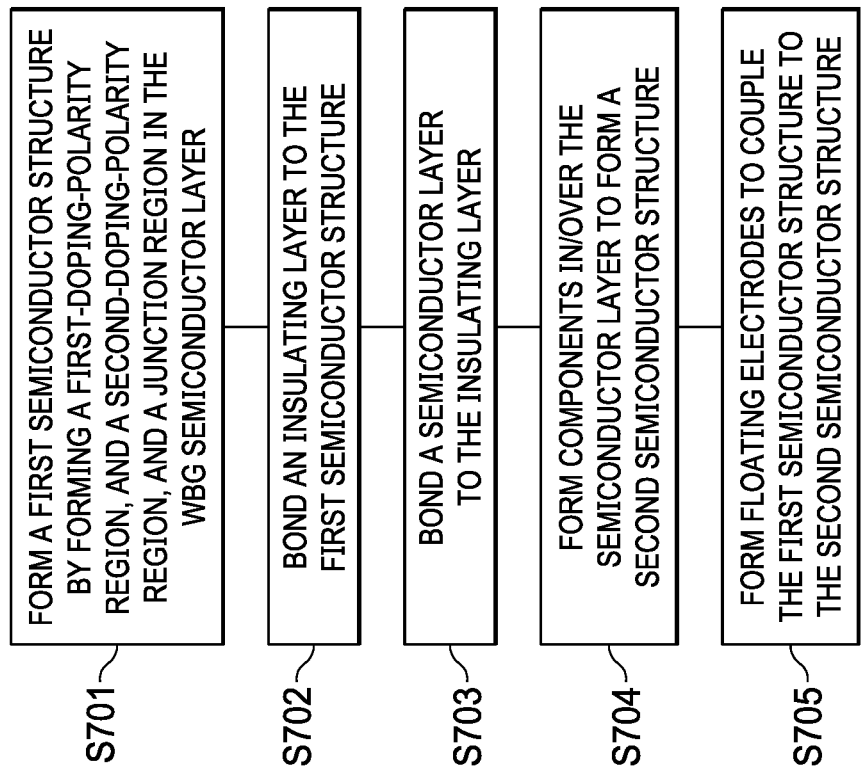
FIG. 7 illustrates a flow chart of an example method for forming a semiconductor device.

FIGS. 1 to 6A, 6B, and 6C illustrate cross-sectional views of structures at various stages of the formation of an example semiconductor device, and FIG. 7 illustrates a corresponding flow chart of an example method for forming the semiconductor device. FIGS. 1-6 will now be described along with references to the flow chart of FIG. 7. FIG. 1 illustrates a wide band-gap (WBG) semiconductor layer 111. FIG. 2 illustrates a first semiconductor structure 110 that includes the WBG semiconductor layer 111 having an n-type semiconductor, and further includes a p-type region 112, an n-type region 114, and a junction region 113 formed in the WBG semiconductor layer 111, and FIG. 7 illustrates this step as forming a first semiconductor structure by forming a first-doping-polarity region, a second-doping-polarity region, and a junction region in the WBG semiconductor layer in step S701. In some examples, the first-doping-polarity region is a p-type region, and the second-doping-polarity region is an n-type region. In other examples, the first-doping-polarity region is an n-type region, and the second-doping-polarity region is an p-type region.

The WBG semiconductor layer 111 includes a WBG semiconductor having a wide band-gap, i.e., a wide energy band-gap. In some examples, the band-gap of the WBG semiconductor of WBG semiconductor layer 111 is in a range of approximately 2 electronvolts (eV) to 4 eV.

In some examples, the WBG semiconductor of the WBG semiconductor layer 111 include silicon carbide, gallium nitride, and/or any other suitable WBG semiconductor. A WBG semiconductor may be a doped semiconductor or an undoped or intrinsic semiconductor.

A doped semiconductor may be a p-type semiconductor which is doped with electron-acceptor dopants or an n-type semiconductor which is doped with electron-donor dopants. Any of the following doping levels may be chosen for the components of the semiconductor device according to various application scenarios. A p-type semiconductor may have a P− doping level that is at a doping level in a range from $10^{14}$ cm$^{-3}$ to $10^{16}$ cm$^{-3}$, a P doping level that is a doping level in a range from $10^{16}$ cm$^{-3}$ to $10^{18}$ cm$^{-3}$, a P+ doping level with that is a doping level in a range from $10^{18}$ cm$^{-3}$ to $10^{20}$ cm$^{-3}$, or any other suitable p-type doping level. An n-type semiconductor may have an N− doping level that is a doping level in a range from $10^{14}$ cm$^{-3}$ to $10^{16}$ cm$^{-3}$, an N doping level that is a doping level in a range from $10^{16}$ cm$^{-3}$ to $10^{18}$ cm$^{-3}$, an N+ doping level that is a doping level in a range from $10^{18}$ cm$^{-3}$ to $10^{20}$ cm$^{-3}$, or any other suitable n-type doping level.

Components in the accompanying drawings may be labeled as a first-doping-polarity semiconductor at a certain doping level, which is merely for illustrative purposes; and a second-doping-polarity semiconductor at another doping level or an undoped semiconductor may be chosen according to various application scenarios. For example, although the WBG semiconductor layer 111 is labeled as an n-type semiconductor at an N− doping level in FIG. 2, the WBG semiconductor layer 111 may be a p-type semiconductor at an P− doping level in certain application scenarios.

In the example of FIG. 2, the first semiconductor structure 110 includes the WBG semiconductor layer 111, a first surface 115, and a second surface 116. Further, a p-type region 112, an n-type region 114, and a junction region 113 between the p-type region 112 and the n-type regions 111 and 114 are formed in the WBG semiconductor layer 111.

In the example of FIG. 2, the WBG semiconductor layer 111 includes doped silicon carbide at a N− doping level; the p-type region 112 at a P− doping level and the n-type region 114 at a N+ doping level are formed in the WBG semiconductor layer 111 by ion implantation; and a junction region 113 is formed between the p-type region 112 and the n-type regions that include the n-type region 114 and the n-type region of the WBG semiconductor layer 111, because of carrier diffusion occurring across the junction between the p-type region and the adjacent n-type regions. The junction region 113 may be a depletion region.

Figure 3:
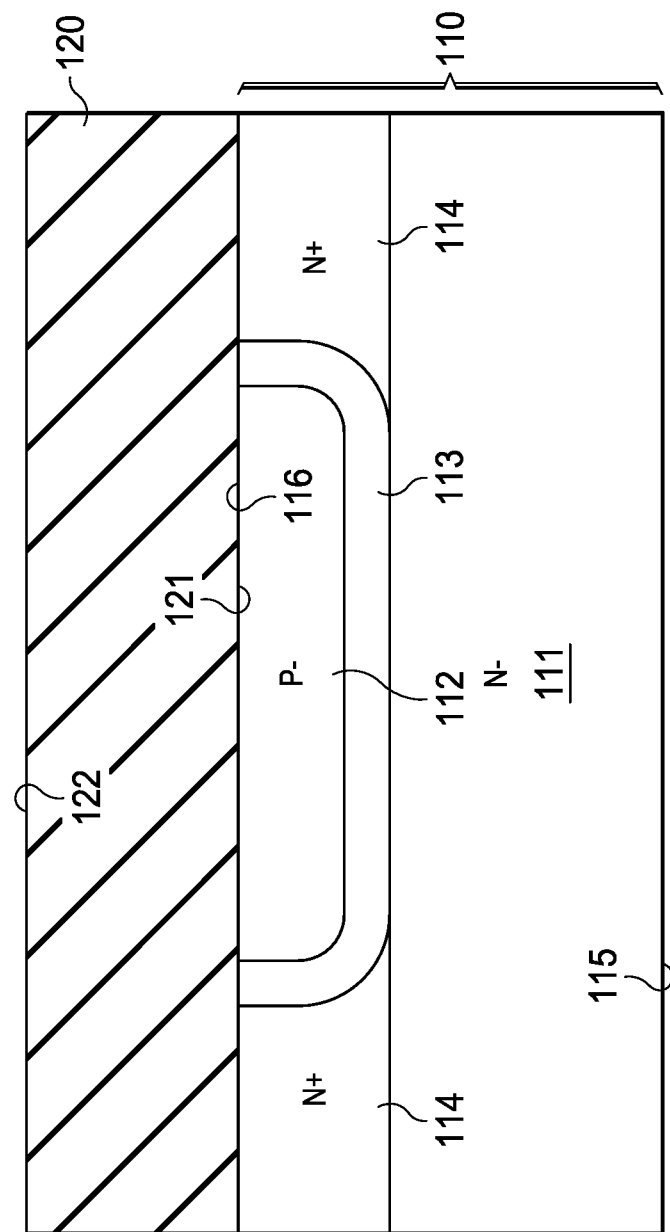

Referring to FIG. 3, an insulating layer 120 is bonded to the first semiconductor structure 110, and also as illustrated by step S702 in FIG. 7. The insulating layer 120 has a first surface 121 and a second opposing surface 122. The first surface 121 of the insulating layer 120 is bonded to the second surface 116 of the first semiconductor structure 110. The insulating layer 120 may include an insulating material, such as silicon dioxide.

Figure 4:
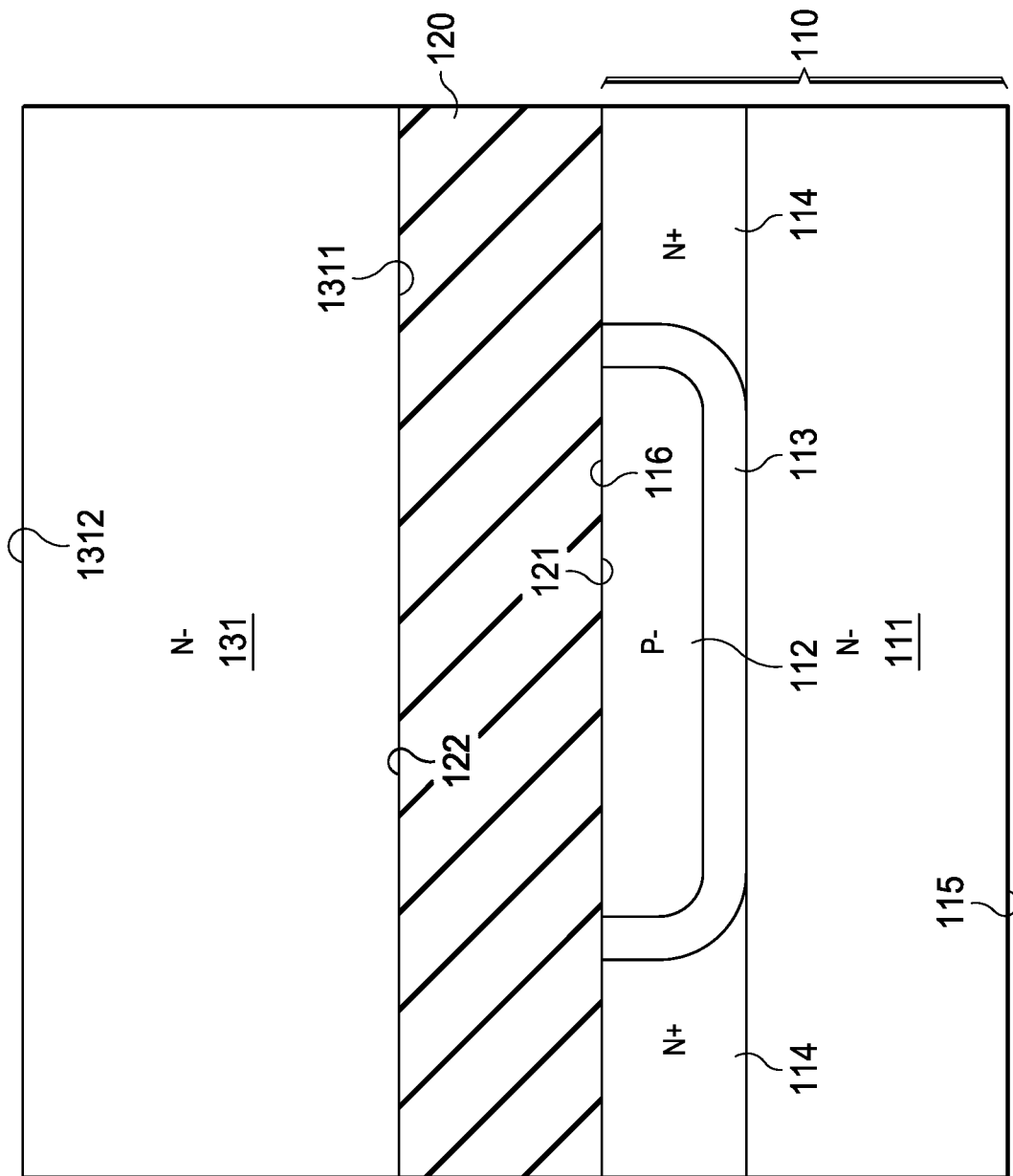

Referring to FIG. 4, a semiconductor layer 131 is bonded to the insulating layer 120, and also as illustrated by step S703 in FIG. 7. The semiconductor layer 131 has a first surface 1311 and a second surface 1312. The first surface 1311 of the semiconductor layer 131 is bonded to the second surface 122 of the insulating layer 120. The semiconductor layer 131 includes a semiconductor material having a band-gap that is smaller than the band-gap of the WBG semiconductor of the WBG semiconductor layer 111.

In some examples, a semiconductor material of the semiconductor layer 131 includes silicon, germanium, gallium arsenide, and/or any other suitable semiconductor material that has a band-gap smaller than the band-gap of the WBG semiconductor of the WBG semiconductor layer 111.

Referring to FIG. 5, components are formed in/over the semiconductor layer 131, and also as illustrated by step S704 in FIG. 7. Accordingly, at steps S703 and S704 in FIG. 7, a second semiconductor structure 130 is formed by, e.g., bonding the semiconductor layer 131 to the insulating layer 120 and forming components in/over the semiconductor layer 131.

In the example of FIG. 5, the formed components includes a p-type region 132, a n-type source region 133, one or more gate dielectric layers 134, and one or more gate terminals 135. The p-type region 132 is a p-type well region having a P− doping level, and is surrounded by the semiconductor layer 131 having an N− doping level. The n-type source region 133 is a source region at an N+ doping level. The gate dielectric layer 134 and the gate terminal 135 are on surfaces 1312, 1322, 1332 of the semiconductor layer 131, the p-type region 132, and the n-type source region 133.

The gate terminal 135 may be provided with a positive bias voltage, and accordingly may result in conductive channels (not shown in FIG. 5) formed in the p-type region 132 near the surface 1322 of the p-type region 132.

In the example of FIG. 5, the second semiconductor structure 130 includes the semiconductor layer 131, the p-type region 132, the n-type source region 133, the gate dielectric layers 134, and the gate terminals 135. The gate terminals 135 extend in a direction parallel to the first surface 1311 of the semiconductor layer 131.

Referring to FIG. 6A, floating electrodes 141 and 145 are formed to couple the first semiconductor structure 110 to the second semiconductor structure 130, and also as illustrated by step S705 in FIG. 7. The floating electrode 141 includes a first end 142 and a second end 143. The floating electrode 141 electrically couples the n-type region 114 to the semiconductor layer 131. The first end 142 of the floating electrode 141 is in contact with the n-type region 114. The contact between the first end 142 and the n-type region 114 may be an ohmic contact. The second end 143 of the floating electrode 141 is in contact with the semiconductor layer 131. The contact between the second end 143 and the semiconductor layer 131 may be an ohmic contact. A floating electrode may electrically couple a first component (such as the n-type region 114) to a second component (such as the semiconductor layer 131), e.g., without being in contact with additional voltage or current terminals other than the components being coupled. A material of a floating electrode may include at least one of metal or silicide.

FIG. 6A also illustrates a coordinate system having X, Y, and Z axes. The X-axis and the Y-axis are orthogonal to each other and are parallel to a plane of the WBG semiconductor layer 111, e.g., the first surface 115 of the WBG semiconductor layer 111. The X and Y-axes are thus referred to as "in-plane direction." The Z-axis is perpendicular to the X and Y-axes and thus perpendicular to the plane of the WBG semiconductor layer 111. As such, the Z-axis is referred to as an "out-of-plane direction."

The area of the contact between a floating electrode and its contacted component may be chosen according to various application scenarios. In the example of FIG. 6A, the area of the contact between the first end 142 of the floating electrode 141 and the n-type region 114 of the first semiconductor structure 110 occupies a portion of available surface of the n-type region 114 facing towards the first end 142. In other example, the size of the floating electrode 141 is increased, such that the area of the contact between the first end 142 of the floating electrode 141 and the n-type region 114 of the first semiconductor structure 110 occupies the entire available surface of the n-type region 114 facing towards the first end 142.

At or adjacent to the contact between a floating electrode and its contacted component, the contacted component may have an increase doping concentration (i.e., doping level). For example, the n-type region 114 of the first semiconductor structure 110 at or adjacent to the contact between the floating electrode 141 and the n-type region 114 of the first semiconductor structure 110 has a higher doping level than the n-type regions 111. In another example, a region (not shown in FIG. 6A) is formed in the semiconductor layer 131 and in contact with the second end 143 of the floating electrode 141, and the region has a higher doping level than the semiconductor layer 131.

Different sizes and locations may be chosen for the p-type region 112 and the n-type region 114 of the first semiconductor structure 110. In some examples, the lateral size of the p-type region 112 is increased, and the lateral size of the n-type region 114 is decreased. In other examples, the lateral size of the p-type region 112 is decreased, and the lateral size of the n-type region 114 is increased.

The floating electrode 141 may be formed by forming a trench 144 extending from the second surface 1312 of the semiconductor layer 131 to the n-type region 114 of the first semiconductor structure 110, and depositing materials of the floating electrode 141 in the trench 144.

The floating electrode 145 includes a first end 146 and a second end 147. The floating electrode 145 electrically couples the p-type region 112 of the first semiconductor structure 110 to the n-type source region 133 of the second semiconductor structure 130. The first end 146 of the floating electrode 145 is in contact with the p-type region 112 of the first semiconductor structure 110. The contact between first end 146 of the floating electrode 145 and the p-type region 112 of the first semiconductor structure 110 may be an ohmic contact. The second end 147 of the floating electrode 145 is in contact with the n-type source region 133 of the second semiconductor structure 130. The contact between the second end 147 of the floating electrode 145 and the n-type source region 133 of the second semiconductor structure 130 may be an ohmic contact. The p-type region 112 of the first semiconductor structure 110 is electrically coupled to the n-type source region 133 of the second semiconductor structure 130 via the floating electrode 145, and may improve voltage distribution in the semiconductor device 100; and, accordingly, the WBG semiconductor layer 111 may provide or serve as a voltage supporting region to take a portion or a large portion of applied voltage on the hybrid semiconductor device 100.

The floating electrode 145 are surrounded by an insulating liner 148, so as to isolate the floating electrode 145 from, e.g., the semiconductor layer 131 of the second semiconductor structure 130. The floating electrode 145 and the insulating liner 148 may be formed by forming a trench 149 extending from the n-type source region 133 of the second semiconductor structure 130 to the p-type region 112 of the first semiconductor structure 110, forming the insulating liner 148 in the trench 149, and depositing the floating electrode 145 in the insulating liner 148.

In the examples of FIG. 6A, the floating electrode 145 are surrounded by an insulating liner 148, so as to isolate the floating electrode 145 from the semiconductor layer 131 of the second semiconductor structure 130. In other examples, the p-type region 132 of the second semiconductor structure 130 extends from the second surface 1312 to the first surface 1311 of the semiconductor layer 131, the insulating liner 148 is not used, and the floating electrode 145 extends from the second surface 1312 of the semiconductor layer 131 to the second surface 116 of the first semiconductor structure 110, and in contact with the n-type source region 133 and the p-type region 132 of the second semiconductor structure 130, and the p-type region 112 of the first semiconductor structure 110. Accordingly, the floating electrode 145 is isolated from the semiconductor layer 131 by the p-type region 132 without the use of the insulating liner 148.

The first-doping-polarity region (e.g, 112), the second-doping-polarity region (e.g., 114), and the junction region (e.g., 113) in the first semiconductor structure 110 may be formed before or after the insulating layer 120 is bonded to the first semiconductor structure 110 or the WBG semiconductor layer 111. In some examples, the first-doping-polarity region and the second-doping-polarity region are formed by ion implantation via the trenches 144 and 149 after the bonding between the insulating layer 120 and the first semiconductor structure 110 and the bonding between the second semiconductor structure 130 and the insulating layer 120. In some other examples, the first-doping-polarity region and the second-doping-polarity region are formed by ion implantation before the bonding between the insulating layer 120 and the first semiconductor structure 110. In some other examples, the first-doping-polarity region is formed by ion implantation before the bonding between the insulating layer 120 and the first semiconductor structure 110, and the second-doping-polarity region is formed by ion implantation after the bonding between the insulating layer 120 and the first semiconductor structure 110, via one or more trenches.

In the examples of FIG. 6A, a semiconductor device 100 is a hybrid semiconductor device that includes the first semiconductor structure 110, the insulating layer 120 on the first semiconductor structure 110, the second semiconductor structure 130 on the insulating layer 120, and the floating electrodes 141 and 145 that couple the first semiconductor structure 110 to the second semiconductor structure 130, where the first semiconductor structure 110 includes a WBG semiconductor having a wide band-gap, and the second semiconductor structure 130 includes a semiconductor material that has a band-gap that is narrower than the band-gap of the WBG semiconductor of the WBG semiconductor layer 111.

In the examples of FIG. 6A, the semiconductor device is a metal-oxide-semiconductor (MOS) field-effect transistor (FET), such as a laterally-diffused metal oxide semiconductor (LDMOS) FET. A drain terminal (not shown in FIG. 6A) is attached to the first surface 115 of the n-type regions 111, and a portion of the n-type regions 111 at the first surface 115 serves as a drain region 117 for the semiconductor device 100. The n-type source region 133 serve as the source region of the semiconductor device 100. When a positive voltage is provided to the gate terminal 135, a conductive channel is formed in the surface region 1321 of the n-type source region 133 that is adjacent to the gate dielectric layers 134 and the gate terminals 135. Further, when a negative bias voltage is provided to the n-type source region 133 via, e.g., a source terminal in contact with the n-type source region 133 (not shown in FIG. 6A), and when a positive voltage is provided to the first surface 115 of the n-type regions 111 via the drain terminal, electrons move along paths 101 from the n-type source region 133 in the second semiconductor structure 130 to the drain region 117 in the first semiconductor structure 110.

Region 118 of the WBG semiconductor layer 111 and the semiconductor layer 131 are coupled to each other via the floating electrodes 141 and region 114. Region 118 and the semiconductor layer 131 both may serve as drift regions of the semiconductor device 100. By such combination, a large portion of the bias voltage between the source and drain of the semiconductor device 100 may drop vertically in or be applied to the WBG semiconductor layer 111, and the WBG semiconductor layer 111 provides or serves as a voltage supporting region to take a portion or a large portion of the applied voltage on the hybrid semiconductor device 100, e.g., in an off-state of the hybrid semiconductor device 100. Accordingly, the voltage applied to the second semiconductor structure 130 corresponding to a lower band-gap may be reduced.

Further, the band-gap of the WBG semiconductor of the WBG semiconductor layer 111 is larger than the bang-gap of the semiconductor material of the second semiconductor structure 130, the critical electric field of the WBG semiconductor of the WBG semiconductor layer 111 is larger than the critical electric field of, e.g., the semiconductor material of the second semiconductor structure 130. Thus, the use of the WBG semiconductor of the WBG semiconductor layer 111 may reduce required thickness for the first semiconductor structure 110, and reduce the size of the semiconductor device 100.

Further, by the combination of the first semiconductor structure 110 having a WBG semiconductor and the second semiconductor structure 130 having a semiconductor corresponding to a lower band-gap, the semiconductor fabrication processes developed for the semiconductor corresponding to the lower band-gap may be utilized, and a lower channel resistance may be achieved by combing the second semiconductor structure 130 having a semiconductor corresponding to a lower band-gap. In one example, the semiconductor corresponding to a lower band-gap is silicon, and the semiconductor fabrication processes developed for silicon may be utilized, and silicon has a lower channel resistance than a WBG semiconductor such as silicon carbide.

The contact between the floating electrode 141 and the n-type region 114/the semiconductor layer 131 may be an ohmic contact; but can be a different type of contact according to application scenarios. The contact between the floating electrode 145 and the p-type region 112/the n-type source region 133 may be an ohmic contact; but can be a different type of contact according to application scenarios.

In the example of FIG. 6A, walls of trenches 144, 149, floating electrodes 141, 145, and insulating liner 148 are shown as being orthogonal to the first surface of 1311 of the semiconductor layer 131. In other examples, walls of trenches 144, 149, floating electrodes 141, 145, and insulating liner 148 can have angles other than 90 degrees with respect to the first surface of 1311 of the semiconductor layer 131, and is not orthogonal to the first surface of 1311 of the semiconductor layer 131. For example, the wall of trench 149 has an angle in a range of approximately 60-80 degrees with respect to the first surface of 1311 of the semiconductor layer 131, and the trench 149 has a shape of conical frustum.

FIG. 6B illustrates a cross-sectional view of the semiconductor device 100 in FIG. 6A along L1-L2 according to an example. In the example of FIG. 6B, a cross-section of the p-type region 112 of the first semiconductor structure 110 across a plane parallel to the first surface 115 of the first semiconductor structure 110 has a circular shape. A cross-section of the junction region 113 of the first semiconductor structure 110 across the plane parallel to the first surface 115 of the first semiconductor structure 110 has an annular shape, and the cross-section of the junction region 113 is between the p-type region 112 of the first semiconductor structure 110 and the n-type region 114 of the first semiconductor structure 110. Various shapes of the p-type region 112, the junction region 113, and the n-type region 114 of the first semiconductor structure 110 may be chosen according to application scenarios.

FIG. 6C illustrates a cross-sectional view of the semiconductor device 100 in FIG. 6A along L3-L4 according to an example. In the example of FIG. 6C, across a plane parallel to the first surface 1311 of the semiconductor layer 131, a cross-section of the floating electrode 145 has a circular shape. A cross-section of the insulating liner 148 has an annular shape, and the insulating liner 148 surrounds the floating electrode 145 and is in the trench 149. Cross-sections of the n-type source region 133, the p-type region 132, and the floating electrode 141 each has an annular shape. Various shapes may be chosen for the components of the semiconductor device 100, such as the semiconductor layer 131, the p-type region 132, the n-type source region 133, and the floating electrode 141, according to application scenarios.

In the example of FIG. 6C, the floating electrode 141 is integrated into one electrode. In other examples, the floating electrode 141 can be separated into multiple electrodes with portions of the semiconductor layer 131 between the multiple electrodes.

FIG. 6D illustrates another example cross-sectional view of the semiconductor device 100 in FIG. 6A along L1-L2 according to described examples; and FIG. 6E illustrates another example cross-sectional view of the semiconductor device 100 in FIG. 6A along L3-L4 according to described examples. In the examples of FIGS. 6B and 6C, certain components (such as 112, 113, 114, 145, 148, 149, 133, 132, 131, 141) of the semiconductor device 100 extend in-plane (e.g., parallel to X-Y plane) in a circular or annular shape. In the examples of FIGS. 6D and 6E, certain components (such as 112, 113, 114, 145, 148, 149, 133, 132, 131, 141) of the semiconductor device 100 extend along an in-plane direction (Y-axis) in a stripe configuration. Some or all components of the semiconductor device 100 may extend in various suitable configurations according to application scenarios.

Figure 8:
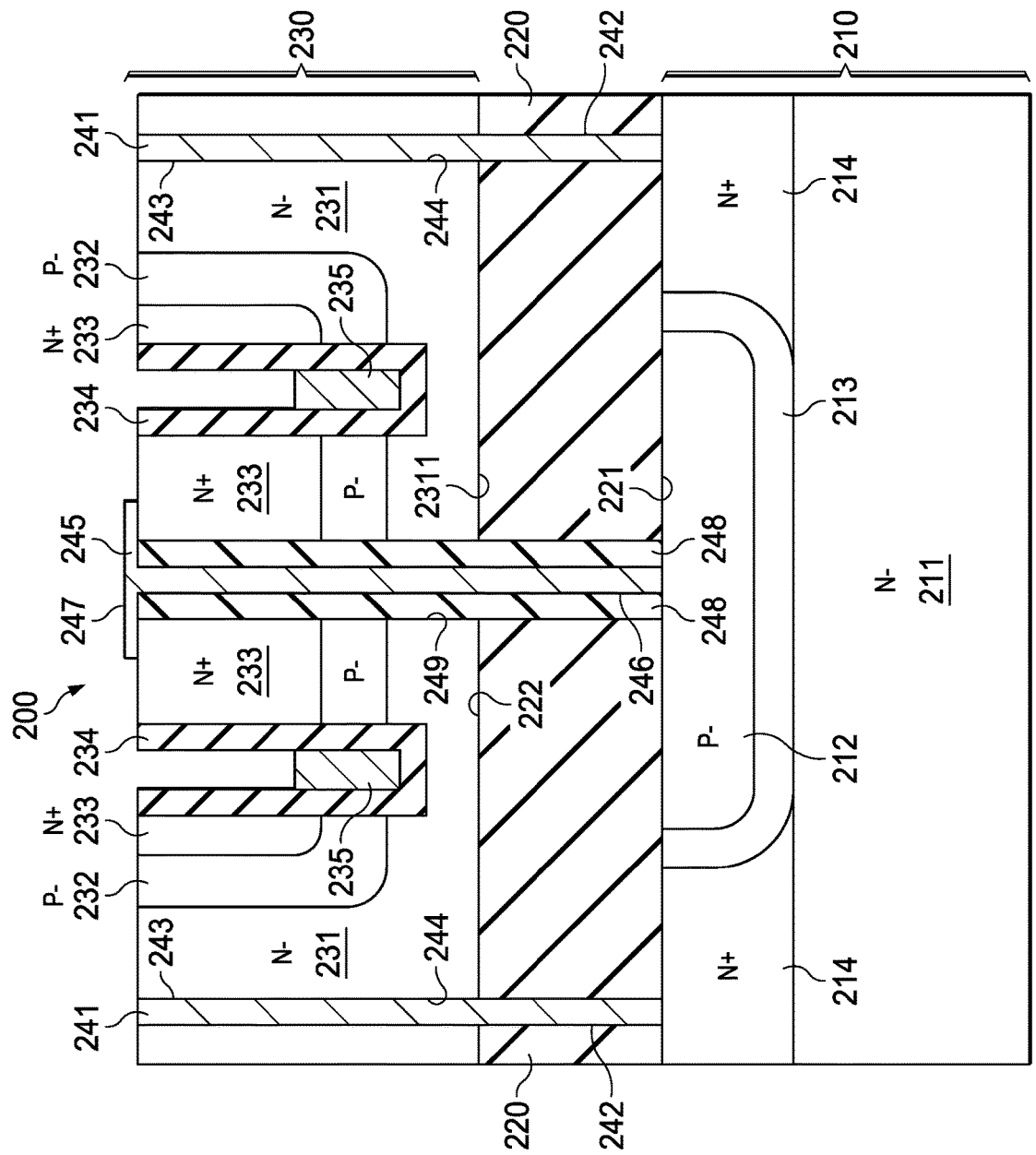
FIG. 8 illustrates a cross-sectional view of another semiconductor device according to described examples.

The formation method in FIG. 7 can form various semiconductor devices consistent with the present disclosure. FIG. 8 illustrates a cross-sectional view of another semiconductor device 200. The semiconductor device 200 includes a first semiconductor structure 210, an insulating layer 220 on the first semiconductor structure 210, a second semiconductor structure 230 on the insulating layer 220, and floating electrodes 241 and 245 that couples the first semiconductor structure 210 to the second semiconductor structure 230, where the first semiconductor structure 210 includes a WBG semiconductor having a wide band-gap, and the second semiconductor structure 230 includes a semiconductor material that has a band-gap smaller than the band-gap of the WBG semiconductor of the first semiconductor structure 210.

The first semiconductor structure 210 includes a WBG semiconductor layer 211 having an n-type semiconductor, and further includes a p-type region 212, an n-type region 214, and a junction region 213 formed in the WBG semiconductor layer 211. The first semiconductor structure 210 is the same as or similar to the above-described first semiconductor structure 110.

The insulating layer 220 has a first surface 221 and a second opposing surface 222. The insulating layer 220 may include an insulating material, such as silicon dioxide. The insulating layer 220 is the same as or similar to the above-described insulating layer 120.

The floating electrode 241 includes a first end 242 and a second end 243. The floating electrode 241 electrically couples the n-type region 214 of the first semiconductor structure 210 to the semiconductor layer 231 of the second semiconductor structure 230. The floating electrode 241 may be formed by forming a trench 244, and depositing materials of the floating electrode 241 in the trench 244. The floating electrode 245 includes a first end 246 and a second end 247. The floating electrode 245 electrically couples the p-type region 212 of the first semiconductor structure 210 to the n-type source region 233 of the second semiconductor structure 230. The floating electrode 245 are surrounded by an insulating liner 248, so as to isolate the floating electrode 245 from, e.g., the semiconductor layer 231 of the second semiconductor structure 230. The floating electrode 245 and the insulating liner 248 may be formed by forming a trench 249, forming the insulating liner 248 in the trench 249, and depositing materials of the floating electrode 245 in the insulating liner 248. The floating electrodes 241 and 245, the trenches 244 and 249, and the insulating liner 248 are the same as or similar to the corresponding components in the semiconductor device 100.

The second semiconductor structure 230 includes an n-type semiconductor layer 231, a p-type region 232, an n-type source region 233, gate dielectric layers 234, gate terminals 235. The gate terminals 235 extend in a direction orthogonal to a first surface 2311 of the n-type semiconductor layer 231, and form vertical gate terminals. The semiconductor device 200 may be a MOS FET having one or more vertical gate terminals.

Certain components of the semiconductor device 200 are the same as or similar to components of the semiconductor device 100, and references can be made to above-descriptions for the semiconductor device 100.

Figure 9:
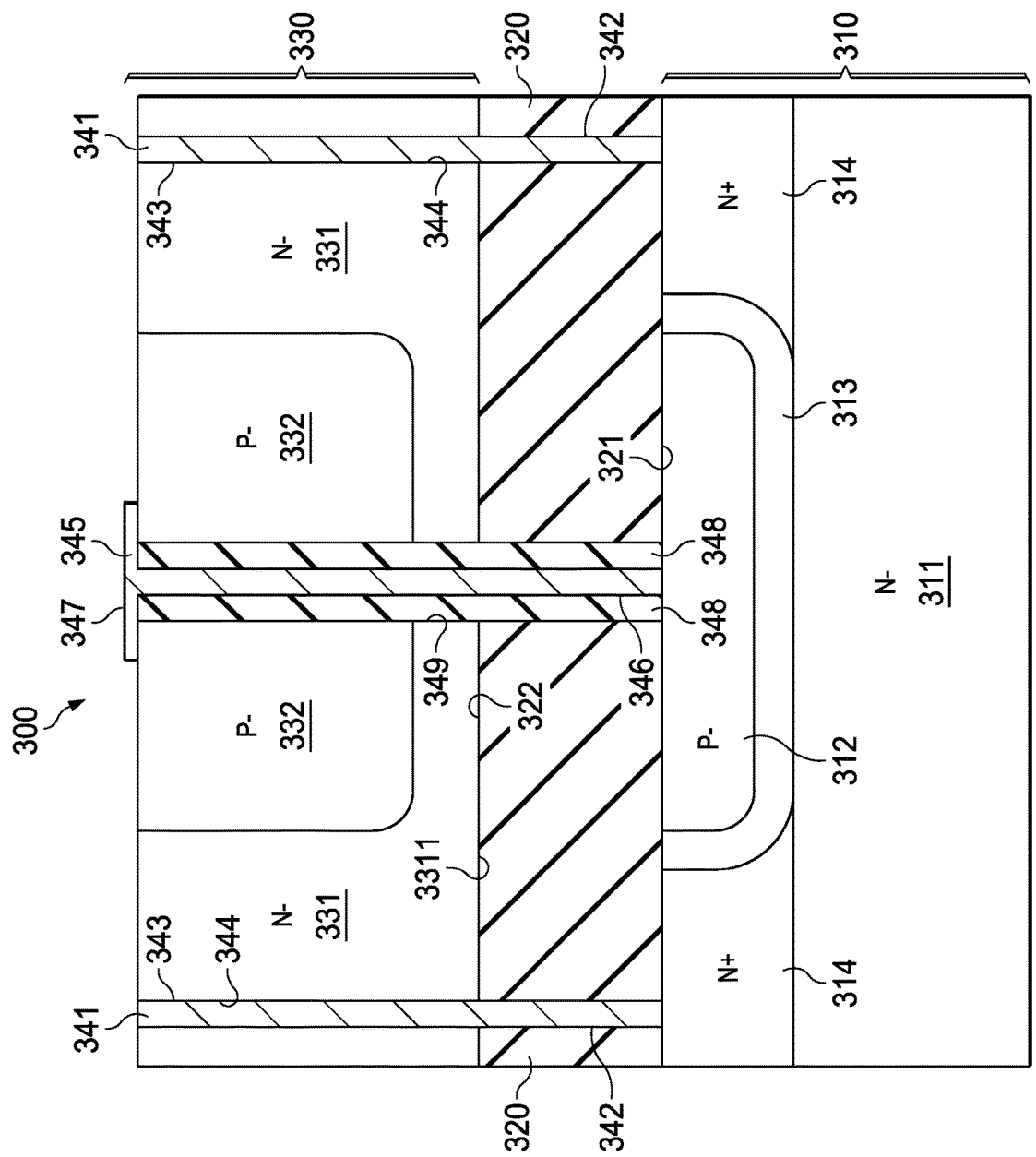
FIG. 9 illustrates a cross-sectional view of another semiconductor device according to described examples.

FIG. 9 illustrates a cross-sectional view of another semiconductor device 300. The semiconductor device 300 includes a first semiconductor structure 310, an insulating layer 320 on the first semiconductor structure 310, a second semiconductor structure 330 on the insulating layer 320, and floating electrodes 341 and 345 that couple the first semiconductor structure 310 to the second semiconductor structure 330, where the first semiconductor structure 310 includes a WBG semiconductor having a wide band-gap, and the second semiconductor structure 330 includes a semiconductor material that has a band-gap smaller than the band-gap of the WBG semiconductor of the first semiconductor structure 310.

The first semiconductor structure 310 includes a WBG semiconductor layer 311 having an n-type semiconductor, and further includes a p-type region 312, an n-type region 314, and a junction region 313 formed in the first semiconductor structure 310. The first semiconductor structure 310 is the same as or similar to the above-described first semiconductor structure 110.

The insulating layer 320 has a first surface 321 and a second opposing surface 322. The insulating layer 320 may include an insulating material, such as silicon dioxide. The insulating layer 320 may be the same as or similar to the above-described insulating layer 120.

The second semiconductor structure 330 includes a semiconductor layer 331 and a p-type region 332. The semiconductor device 300 may be a diode. The floating electrode 341 includes a first end 342 and a second end 343. The floating electrode 341 electrically couples the n-type region 314 of the first semiconductor structure 310 to the semiconductor layer 331. The floating electrode 341 may be formed by forming a trench 344, and depositing materials of the floating electrode 341 in the trench 344. The floating electrode 345 includes a first end 346 and a second end 347. The floating electrode 345 electrically couples the p-type region 312 of the first semiconductor structure 310 to the p-type region 332 of the second semiconductor structure 330. The floating electrode 345 are surrounded by an insulating liner 348, so as to isolate the floating electrode 345 from, e.g., the semiconductor layer 331 of the second semiconductor structure 330. The floating electrode 345 and the insulating liner 348 may be formed by forming a trench 349, forming the insulating liner 348 in the trench 349, and depositing materials of the floating electrode 345 in the insulating liner 348. The floating electrodes 341 and 345, the trenches 344 and 349, and the insulating liner 348 are the same as or similar to the corresponding components in the semiconductor device 100.

Certain components of the semiconductor device 300 are the same as or similar to components of the semiconductor device 300, and references can be made to above-descriptions for the semiconductor device 100.

Figure 10:
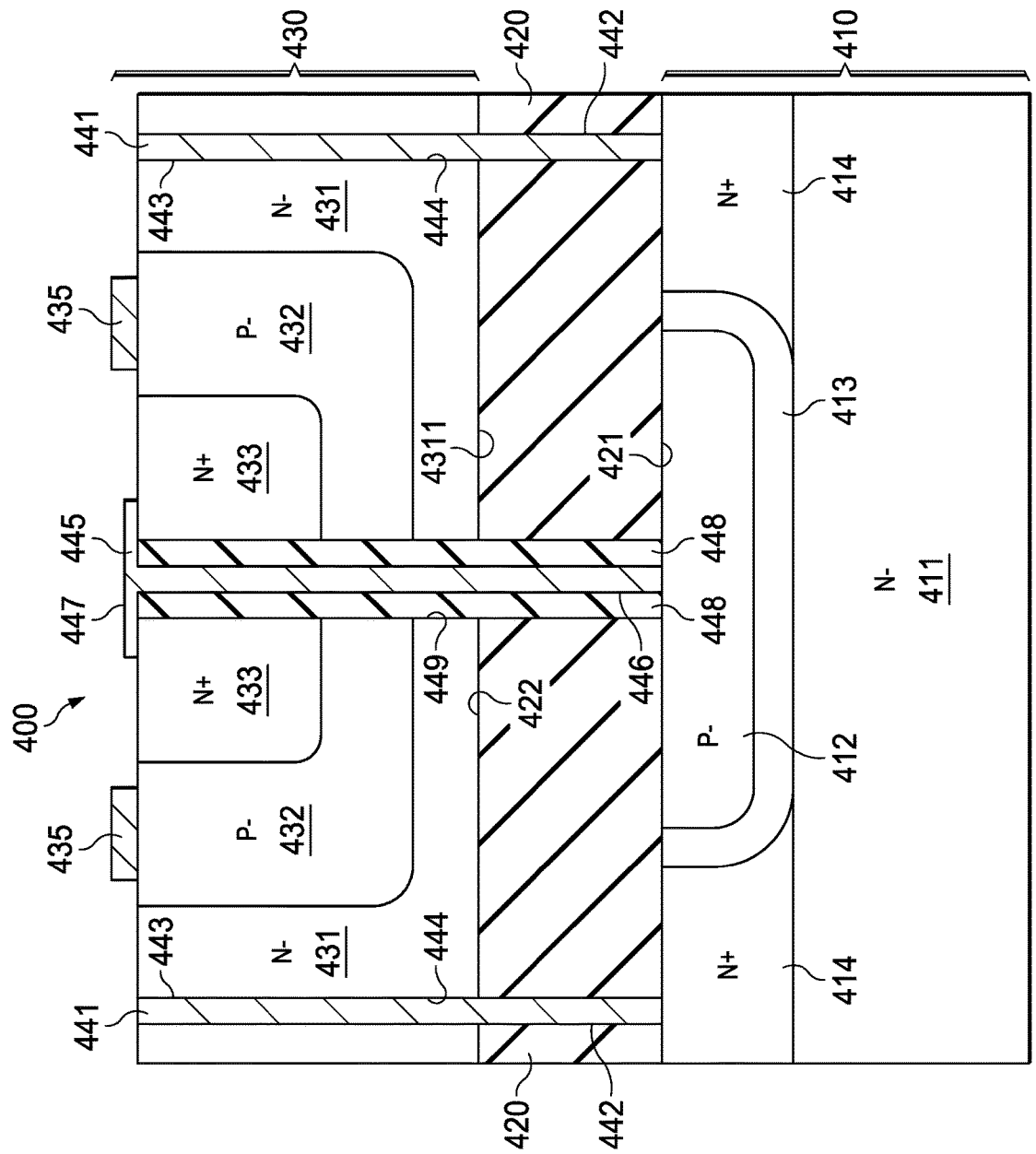
FIG. 10 illustrates a cross-sectional view of another semiconductor device according to described examples.

FIG. 10 illustrates a cross-sectional view of another semiconductor device 400. The semiconductor device 400 includes a first semiconductor structure 410, an insulating layer 420 on the first semiconductor structure 410, a second semiconductor structure 430 on the insulating layer 420, and floating electrodes 441 and 445 that couple the first semiconductor structure 410 to the second semiconductor structure 430, where the first semiconductor structure 410 includes a WBG semiconductor having a wide band-gap, and the second semiconductor structure 430 includes a semiconductor material that has a band-gap that is smaller than the band-gap of the WBG semiconductor of the first semiconductor structure 410.

The first semiconductor structure 410 includes a WBG semiconductor layer 411 having an n-type semiconductor at an N− doping level, and further includes a p-type region 412 at a P− doping level, an n-type region 414 at an N+ doping level, and a junction region 413. The first semiconductor structure 410 is the same as or similar to the above-described first semiconductor structure 110.

The insulating layer 420 has a first surface 421 and a second opposing surface 422. The insulating layer 420 may include an insulating material, such as silicon dioxide. The insulating layer 420 is the same as or similar to the above-described insulating layer 120.

The second semiconductor structure 430 includes a semiconductor layer 431 at an N− doping level, a p-type region 432 at a P− doping level, an n-type region 433 at an N+ doping level, base terminals 435 on and in contact with the p-type region 432. The base terminals 435 extend in a direction parallel to the first surface 421 of the insulating layer 420, and form vertical gate terminals. In the example of FIG. 10, the semiconductor device 400 is a bipolar transistor. Cross-sections of certain components of second semiconductor structure 430, such as 432, 433, 435, 448, may have annular shapes across a plane parallel to the first surface 4311 of the n-type semiconductor layer 431, or any other suitable shapes.

The floating electrode 441 includes a first end 442 and a second end 443. The floating electrode 441 electrically couples the n-type region 414 of the first semiconductor structure 410 to the semiconductor layer 431 of the second semiconductor structure 430. The floating electrode 441 may be formed by forming a trench 444, and depositing materials of the floating electrode 441 in the trench 444. The floating electrode 445 includes a first end 446 and a second end 447. The floating electrode 445 electrically couples the p-type region 412 of the first semiconductor structure 410 to the n-type region 433 of the second semiconductor structure 430. The floating electrode 445 are surrounded by an insulating liner 448, so as to isolate the floating electrode 445 from, e.g., the semiconductor layer 431 of the second semiconductor structure 430. The floating electrode 445 and the insulating liner 448 may be formed by forming a trench 449, forming the insulating liner 448 in the trench 449, and depositing materials of the floating electrode 445 in the insulating liner 448. The floating electrodes 441 and 445, the trenches 444 and 449, and the insulating liner 448 may be the same as or similar to the corresponding components in the semiconductor device 100.

Certain components of the semiconductor device 400 are the same as or similar to components of the semiconductor device 100, and references can be made to above-descriptions for the semiconductor device 100.

Figure 11:
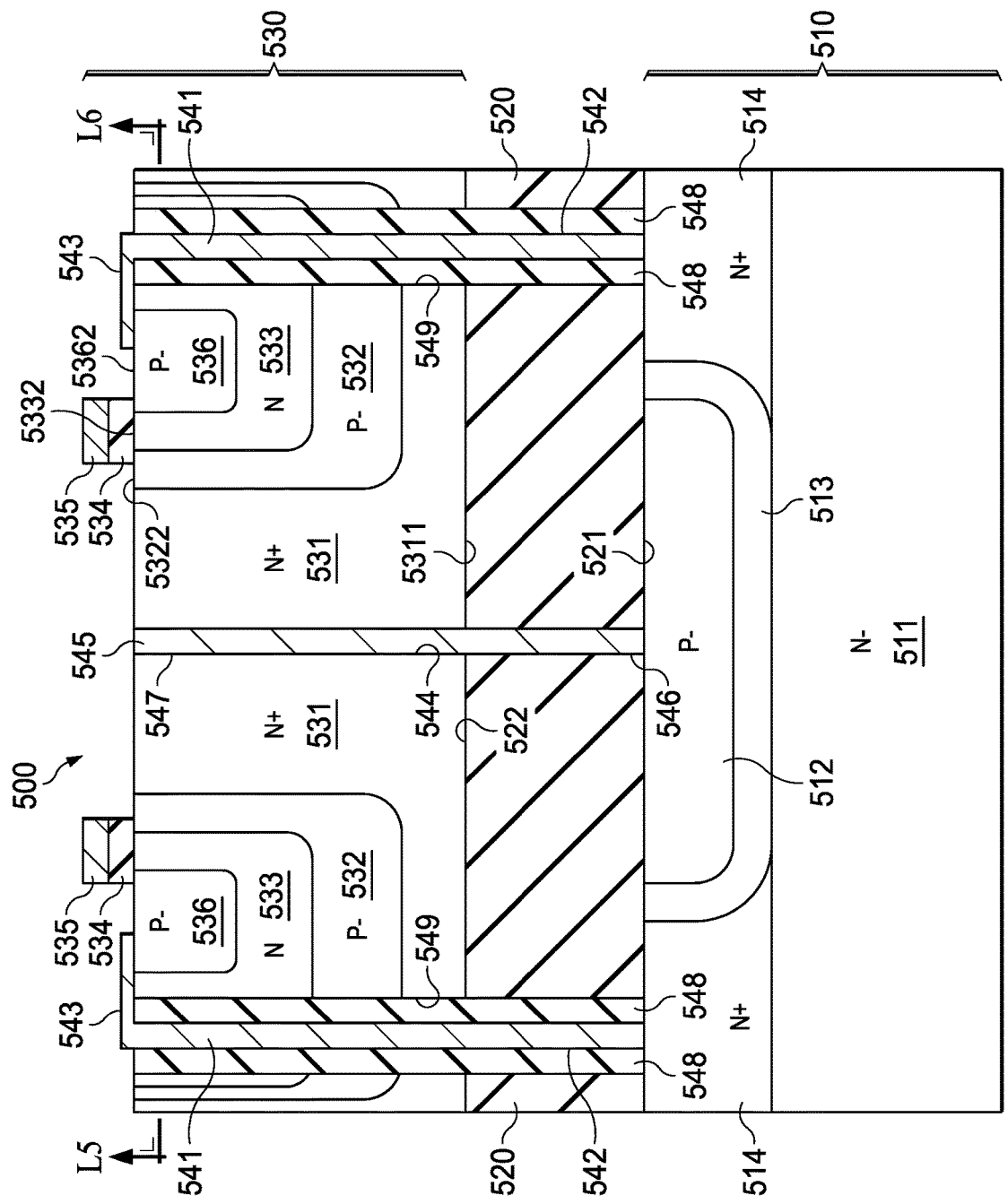
FIG. 11 illustrates a cross-sectional view of another semiconductor device according to described examples.

FIG. 11 illustrates a cross-sectional view of another semiconductor device 500. The semiconductor device 500 includes a first semiconductor structure 510, an insulating layer 520 on the first semiconductor structure 510, a second semiconductor structure 530 on the insulating layer 520, and floating electrodes 541 and 545 that couple the first semiconductor structure 510 to the second semiconductor structure 530, where the first semiconductor structure 510 includes a WBG semiconductor having a wide band-gap, and the second semiconductor structure 530 includes a semiconductor material that has a band-gap smaller than the band-gap of the WBG semiconductor of the first semiconductor structure 510.

The first semiconductor structure 510 includes a WBG semiconductor layer 511 having an n-type semiconductor at an N− doping level, and further includes a p-type region 512 at a P− doping level, an n-type region 514 at an N+ doping level, and a junction region 513 formed between the p-type region 512 and the WBG semiconductor layer 511/the n-type region 514. The first semiconductor structure 510 may be the same as or similar to the above-described first semiconductor structure 110.

The insulating layer 520 has a first surface 521 and a second opposing surface 522. The insulating layer 520 may include an insulating material, such as silicon dioxide. The insulating layer 520 may be the same as or similar to the above-described insulating layer 120.

The second semiconductor structure 530 includes an n-type semiconductor layer 531 at an N+ doping level, an p-type semiconductor region 532 at a P− doping level, an n-type semiconductor region 533 at an N doping level, and an p-type semiconductor region 534 at a P− doping level, one or more gate dielectric layers 534 and gate terminals 535.

The p-type semiconductor region 532 is a p-type well region, and is surrounded by the n-type semiconductor layer 531. The n-type semiconductor region 533 is surrounded by the p-type region 532, and the p-type semiconductor region 536 is surrounded by the n-type semiconductor region 533. The gate dielectric layer 534 and the gate terminal 535 are on surfaces 5322, 5332, 5362 of the p-type region 532, the n-type semiconductor region 533, and the p-type semiconductor region 536. When the gate terminal 535 is provided with a negative bias voltage, conductive channels (not shown in FIG. 11) may be formed in the n-type semiconductor region 533 near the surface 5332 of the n-type semiconductor region 533, and the conductive channels may electrically couple the p-type semiconductor region 532 to the p-type semiconductor region 536. The gate terminals 535 extend in a direction parallel to a first surface 5311 of the n-type semiconductor layer 531, and form lateral gate terminals.

The floating electrode 541 includes a first end 542 and a second end 543. The floating electrode 541 electrically couples the n-type semiconductor region 514 of the first semiconductor structure 510 to the p-type semiconductor region 536 and the n-type semiconductor region 533. The floating electrode 541 is surrounded by insulating liners 548, so as to isolate the floating electrode 541 from, e.g., the semiconductor layer 531 of the second semiconductor structure 530. The floating electrode 541 may be formed by forming a trench 549, forming the insulating liner 548 in the trench 549, and depositing materials of the floating electrode 541 in and over insulating liner 548 and the trench 544. The floating electrode 545 includes a first end 546 and a second end 547.

The floating electrode 545 electrically couples the p-type region 512 of the first semiconductor structure 510 to the n-type semiconductor layer 531 of the second semiconductor structure 530. The floating electrode 545 may be formed by forming a trench 544, and depositing materials of the floating electrode 545 in the trench 544. In the example of FIG. 11, the semiconductor device 500 is an isolated gate bipolar transistor (IGBT). In some examples, an IGBT is an lateral isolated gate bipolar transistor (LIGBT) having a lateral gate terminal extending parallel to, e.g., first surface 5311 of the n-type semiconductor layer 531.

Certain components of the semiconductor device 500 may be the same as or similar to components of the semiconductor device 500, and references can be made to above-descriptions for the semiconductor device 100.

Cross-sections of certain components of second semiconductor structure 530, such as 532, 533, 536, 534, 535, may have annular shapes across a plane parallel to the first surface 5311 of the n-type semiconductor layer 531, or any other suitable shapes.

For example, cross-sections of the p-type semiconductor region 532, n-type semiconductor region 533, and p-type semiconductor region 536 across L5-L6 (see FIG. 11)

include one or more annular shapes. However, the p-type semiconductor region 532, n-type semiconductor region 533, and p-type semiconductor region 536 can have any suitable shapes.

In the present disclosure, the semiconductor device may include a first semiconductor structure having a WBG semiconductor, an insulating layer, a second semiconductor structure having a semiconductor with a narrower band-gap than the WBG semiconductor, and floating electrodes coupling the first semiconductor structure to the second semiconductor structure. The WBG semiconductor or a portion of the WBG semiconductor may serve as or provide a voltage supporting region to take a portion or a large portion of the applied voltage on the semiconductor device. Accordingly, the voltage applied to the first semiconductor structure may be reduced, and the critical voltage applied to the semiconductor device may be increased.

P-type, n-type, intrinsic type/semiconductor, and certain doping levels may be used in the descriptions and drawings for components of the semiconductor devices. However, some or all of the structures of the semiconductor devices consistent with the present disclosure may have a different doping type (e.g., a different doping polarity) and a different doping level according to various application scenarios. The doping types and doping levels may be chosen according to application scenarios.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A semiconductor device, comprising:
    a first semiconductor layer with a planar surface, the first semiconductor layer including a first semiconductor material with a first band-gap, wherein the first semiconductor layer has a p-type region, an n-type region, and a depletion region formed between the p-type and n-type regions;
    an insulating layer with first and second opposing surfaces, the first surface of the insulating layer abutting the planar surface of the first semiconductor layer;
    a second semiconductor layer abutting the second surface of the insulating layer, the second semiconductor layer including a second semiconductor material with a second band-gap less than the first band-gap; and
    an electrode coupling the first semiconductor layer to the second semiconductor layer.

2. The semiconductor device of claim 1, wherein the first semiconductor layer, the insulating layer, the second semiconductor layer, and the electrode form a switching device.

3. The semiconductor device of claim 2, wherein the switching device includes a diode, a bipolar transistor, a metal oxide semiconductor field-effect transistor, or an insulated-gate bipolar transistor.

4. The semiconductor device of claim 2, wherein the switching device includes a first terminal coupled to the first semiconductor layer and a second terminal coupled to the second semiconductor layer.

5. The semiconductor device of claim 4, wherein the switching device includes a gate terminal coupled to the second semiconductor layer.

6. The semiconductor device of claim 1, wherein the first semiconductor layer includes a voltage supporting region configured to take a portion of voltage applied to the semiconductor device.

7. The semiconductor device of claim 1, wherein the first semiconductor layer includes silicon carbide or gallium nitride.

8. The semiconductor device of claim 1, wherein the first band-gap ranges between approximately 2 electron volts (eV) to 4 eV.

9. The semiconductor device of claim 1, wherein the second semiconductor layer includes silicon, germanium, or gallium arsenide.

10. The semiconductor device of claim 1, wherein the p-type region has a circular shape.

11. The semiconductor device of claim 1, wherein the p-type region has a stripe configuration.

12. The semiconductor device of claim 1, wherein the electrode is a first electrode forming a first ohmic contact to the n-type region of the first semiconductor layer, the semiconductor device further comprising:
    a second electrode forming a second ohmic contact to the p-type region of the first semiconductor layer.

13. A semiconductor device, comprising:
    a first semiconductor layer including a first semiconductor material with a first band-gap, wherein the first semiconductor layer includes a first n-type region and a first p-type region within the first n-type region;
    a dielectric layer with first and second opposing surfaces, the first surface of the dielectric layer abutting the first semiconductor layer;
    a second semiconductor layer abutting the second surface of the dielectric layer, the second semiconductor layer including a second semiconductor material with a second band-gap less than the first band-gap; and
    an electrode coupling the first semiconductor layer to the second semiconductor layer.

14. The semiconductor device of claim 13, wherein the electrode extends through the dielectric layer.

15. The semiconductor device of claim 13, wherein:
    the second semiconductor layer includes a second p-type region and a second n-type region; and
    the electrode couples the first n-type region of the first semiconductor layer to the second n-type region of the second semiconductor layer.

16. The semiconductor device of claim 15, further comprising:
    a second electrode coupling the first p-type region of the first semiconductor layer to the second p-type region of the second semiconductor layer.

17. The semiconductor device of claim 16, wherein the second electrode is surrounded by an insulating liner.

18. The semiconductor device of claim 16, wherein the second electrode extends through the dielectric layer.

19. The semiconductor device of claim 15, further comprising:
    a cathode terminal coupled to the first n-type region of the first semiconductor layer; and
    an anode terminal coupled to the second p-type region of the second semiconductor layer.

20. The semiconductor device of claim 13, wherein the first semiconductor layer includes a voltage supporting region configured to take a portion of voltage applied to the semiconductor device.

* * * * *